US012596415B2

(12) United States Patent
Ma et al.

(10) Patent No.: US 12,596,415 B2
(45) Date of Patent: Apr. 7, 2026

(54) MANAGING THERMAL CAPABILITIES OF AN INFORMATION HANDLING SYSTEM IN A CHAMBER-LESS ENVIRONMENT

(71) Applicant: Dell Products L.P., Round Rock, TX (US)

(72) Inventors: Xin Zhi Ma, Shanghai (CN); Seth Weber, Manor, TX (US); Ying Hua Huang, Shanghai (CN); Jianguo Zhang, Beijing (CN)

(73) Assignee: Dell Products L.P., Round Rock, TX (US)

( * ) Notice: Subject to any disclaimer, the term of this patent is extended or adjusted under 35 U.S.C. 154(b) by 392 days.

(21) Appl. No.: 18/351,595

(22) Filed: Jul. 13, 2023

(65) Prior Publication Data

US 2025/0024635 A1     Jan. 16, 2025

(51) Int. Cl.
G06F 1/20          (2006.01)
H05K 7/20          (2006.01)
(52) U.S. Cl.
CPC ......... G06F 1/206 (2013.01); H05K 7/20136 (2013.01); H05K 7/20209 (2013.01)
(58) Field of Classification Search
CPC   G06F 1/206; H05K 7/20136; H05K 7/20209; H05K 7/20836
USPC ....................................................... 700/300
See application file for complete search history.

(56) References Cited

U.S. PATENT DOCUMENTS

| | | | |
|---|---|---|---|
| 2005/0210896 A1* | 9/2005 | Durant ................... | G06F 1/206 |
| | | | 62/178 |
| 2014/0032011 A1* | 1/2014 | Artman ............... | G06F 9/44505 |
| | | | 700/300 |
| 2016/0239067 A1* | 8/2016 | Lovicott ................. | G06F 1/206 |
| 2017/0303438 A1* | 10/2017 | Shabbir .............. | H05K 7/20209 |
| 2017/0318707 A1* | 11/2017 | Shabbir .............. | H05K 7/20836 |
| 2019/0313552 A1* | 10/2019 | Curtis ................ | H05K 7/20836 |
| 2020/0045858 A1* | 2/2020 | Curtis ................ | H05K 7/20836 |
| 2023/0070036 A1* | 3/2023 | He .......................... | G06F 1/189 |

* cited by examiner

*Primary Examiner* — Chun Cao
(74) *Attorney, Agent, or Firm* — McDermott Will & Schulte LLP

(57)              ABSTRACT

Managing thermal capabilities of an information handling system, including identifying a maximum supported ambient temperature of the information handling system; identifying a current ambient temperature of the information handling system; calculating a temperature delta based on the maximum supported ambient temperature of the information handling system and the current ambient temperature of the information handling system; adjusting, based on the temperature delta, one or more thermal control trigger points; adjusting, based on the adjusted thermal control trigger points, a fan speed of a fan of the information handling system; and determining, based on the adjusted fan speed of the fan, an updated cooling capacity associated with the information handling system.

17 Claims, 4 Drawing Sheets

Identify Maximum Supported Ambient Temperature 302

Identify Current Ambient Temperature 304

Calculate Temperature Delta 306

Adjust Thermal Control Trigger Points 308

Adjust Fan Speed 310

Determine Updated Cooling Capacity 312

*300*

Identify Maximum
Supported Ambient
Temperature
*302*

Identify Current
Ambient
Temperature
*304*

Calculate
Temperature Delta
*306*

Adjust Thermal
Control Trigger
Points          *308*

Adjust Fan Speed
*310*

Determine
Updated Cooling
Capacity    *312*

MANAGING THERMAL CAPABILITIES OF AN INFORMATION HANDLING SYSTEM IN A CHAMBER-LESS ENVIRONMENT

BACKGROUND

Field of the Disclosure

The disclosure relates generally to an information handling system, and in particular, managing thermal capabilities of an information handling system in a chamber-less environment.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a method of managing thermal capabilities of an information handling system, including identifying a maximum supported ambient temperature of the information handling system; identifying a current ambient temperature of the information handling system; calculating a temperature delta based on the maximum supported ambient temperature of the information handling system and the current ambient temperature of the information handling system; adjusting, based on the temperature delta, one or more thermal control trigger points; adjusting, based on the adjusted thermal control trigger points, a fan speed of a fan of the information handling system; and determining, based on the adjusted fan speed of the fan, an updated cooling capacity associated with the information handling system.

Other embodiments of these aspects include corresponding systems, apparatus, and computer programs, configured to perform the actions of the methods, encoded on computer storage devices.

These and other embodiments may each optionally include one or more of the following features. For instance, dissipating, based on the updated cooling capacity associated with the information handling system, heat of the information handling system. After adjusting the thermal control trigger points, maintaining a computing workload level performed by a processor of the information handling system. Adjusting, based on the temperature delta, a thermal behavior trigger threshold associated with the processor of the information handling system; determining, based on performing the computing workload level, a current temperature of the processor; comparing the current temperature of the processor with the adjusted thermal behavior trigger threshold; determining, based on the comparing, that the current temperature of the processor is greater than the adjusted thermal behavior trigger threshold; and in response to determining that the current temperature of the processor is greater than the adjusted thermal behavior trigger threshold, updating an indicator to indicate throttling of the processor when the current ambient temperature of the information handling system is greater than or equal to the maximum supported ambient temperature of the information handling system. Decreasing the thermal behavior trigger threshold by the temperature delta. In response to determining that the current temperature of the processor is greater than the adjusted thermal behavior trigger threshold, displaying a notification on a display of the information handling system indicating the throttling when the current ambient temperature of the information handling system is greater than or equal to the maximum supported ambient temperature of the information handling system. Adjusting the thermal control trigger points further includes overriding a value indicated by a current ambient temperature indicator to the maximum supported ambient temperature. Adjusting the thermal control trigger points further includes overriding a value indicated by a target temperature indicator of a processor of the information handling system based on the temperature delta. Overriding the value indicated by the target temperature indicator of the processor further includes decreasing the value indicated by the target temperature indicator of the processor by the temperature delta.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
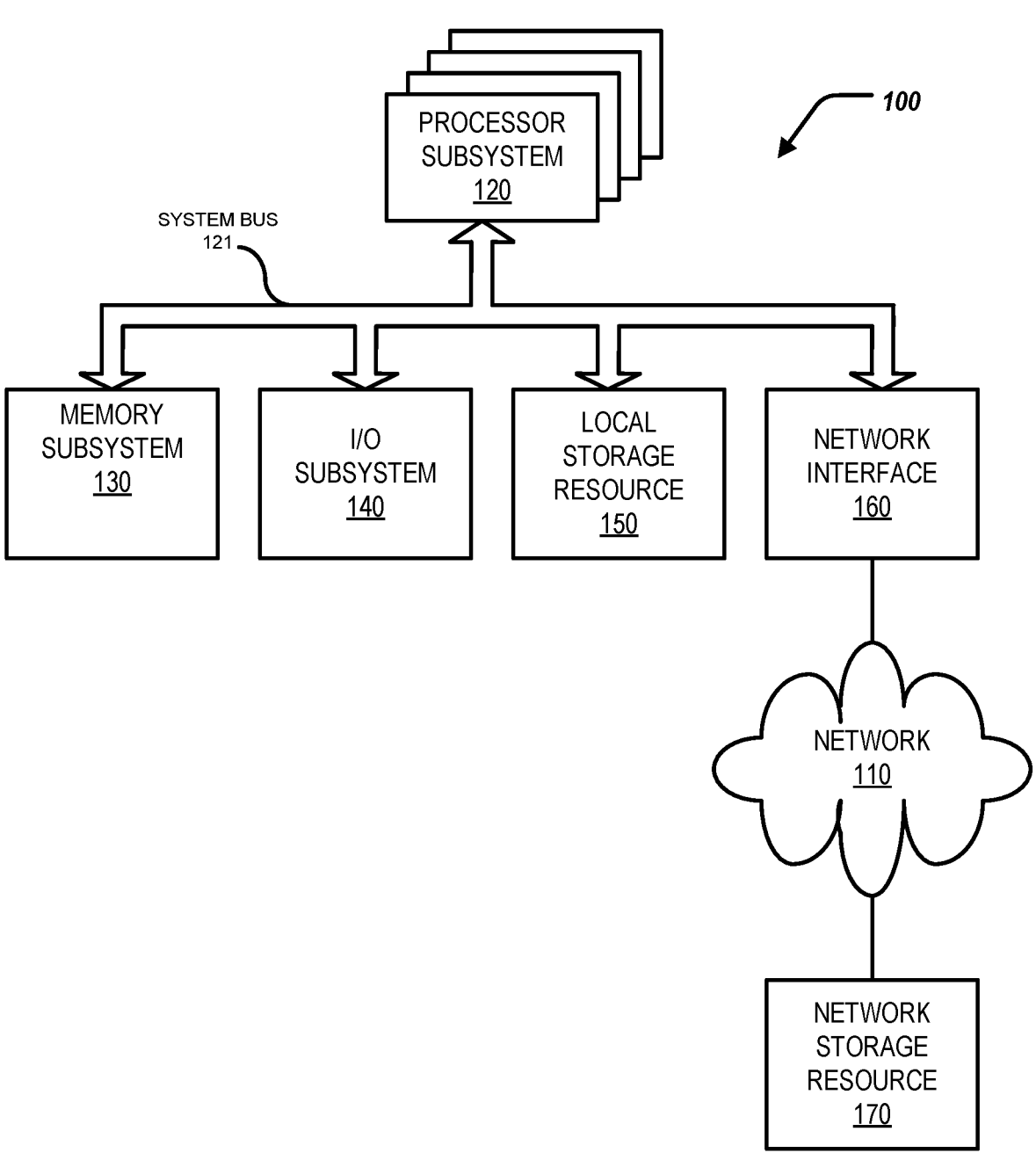
FIG. 1 is a block diagram of selected elements of an embodiment of an information handling system.

This disclosure discusses methods and systems for managing thermal capabilities of an information handling system. In short, the fan speed of the fans of the information handling system can be adjusted to simulate system airflow about the information handling system based on a maximum supported ambient temperature of the information handling system while the information handling system is at a lower temperature environment. Thus, a thermal capacity of the information handling system can be determined (cooling capacity) in a chamber-less environment.

Specifically, this disclosure discusses a system and a method for managing thermal capabilities of an information handling system, including identifying a maximum supported ambient temperature of the information handling system; identifying a current ambient temperature of the information handling system; calculating a temperature delta based on the maximum supported ambient temperature of the information handling system and the current ambient temperature of the information handling system; adjusting, based on the temperature delta, one or more thermal control trigger points; adjusting, based on the adjusted thermal control trigger points, a fan speed of a fan of the information handling system; and determining, based on the adjusted fan speed of the fan, an updated cooling capacity associated with the information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-4 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
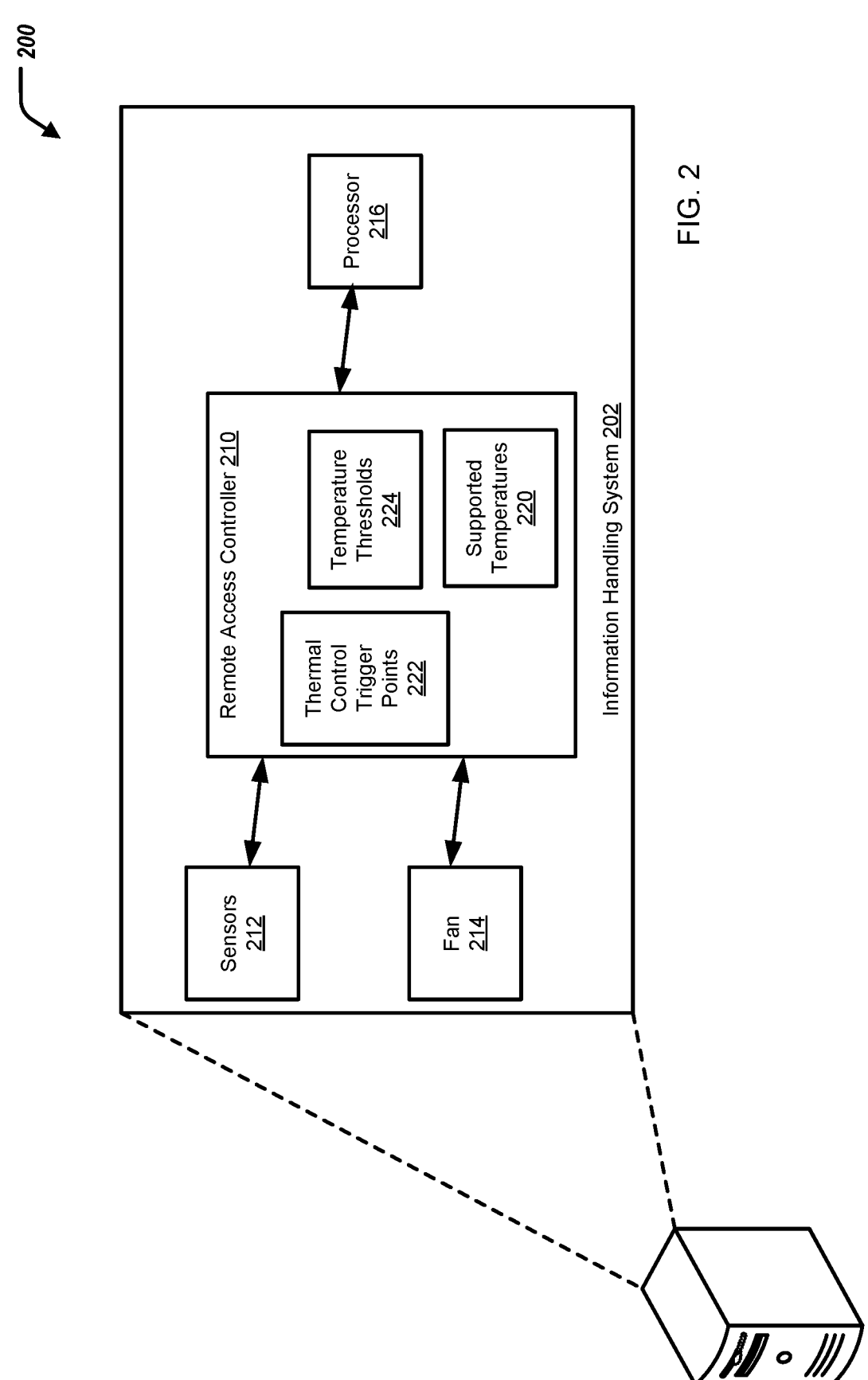
FIG. 2 illustrates a block diagram of an information handling system for managing thermal capabilities.

Turning to FIG. 2, FIG. 2 illustrates an environment 200 including an information handling system 202. The information handling system 202 can include a remote access controller (RAC) 210, sensors 212, a fan 214 (or fans 214), and a processor 216. In some examples, the information handling system 202 is similar to, or includes, the information handling system 100 of FIG. 1. In some examples, the processor 216 is the same, or substantially the same, as the processor subsystem 120 of FIG. 1.

The RAC 210 can be in communication with the sensors 212, the fan 214, and the processor 216.

In short, the RAC 210 can adjust the fan speed of the fan 214 (or fans 214) to simulate system airflow about the information handling system 202 based on a maximum supported ambient temperature of the information handling system 202 while the information handling system 202 is at a lower temperature environment. Thus, a thermal capacity of the information handling system 202 can be determined (cooling capacity) in a chamber-less environment.

Figure 3:
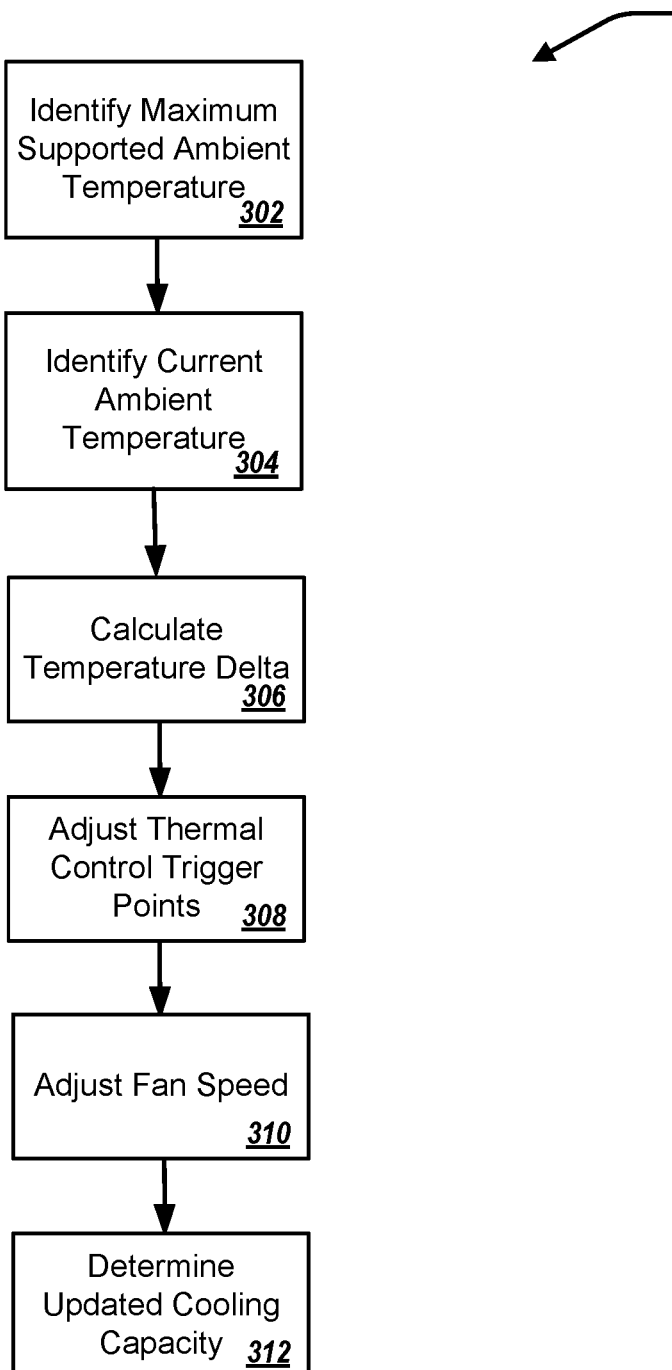
FIGS. 3, 4 illustrates respective methods for managing thermal capabilities at the information handling system.

FIG. 3 illustrates a flowchart depicting selected elements of an embodiment of a method 300 for managing thermal capabilities at the information handling system. The method 300 may be performed by the information handling system 100, the information handling system 202 and/or RAC 210, and with reference to FIGS. 1-2. It is noted that certain operations described in method 300 may be optional or may be rearranged in different embodiments.

The RAC 210 can identify a maximum supported ambient temperature of the information handling system 202, at 302. Specifically, the RAC 210 can store data indicating the maximum supported ambient temperature 220 of the information handling system 200 (or the RAC 210 can have access to data indicating the temperature thresholds 220 stored at a data store). The maximum supported ambient temperature 220 is the maximum ambient temperature of the environment 200 that the information handling system 202 is supported for. For example, the maximum supported ambient temperature 220 can indicate a temperature of 35° Celsius. In some examples, the RAC 210 can also store data indicating a minimum supported ambient temperature 220 of the information handling system 200.

The RAC 210 can identify a current ambient temperature of the information handling system 202, at 304. That is, the RAC 210 is in communication with the sensors 212. The sensors 212 can include a temperature sensor that can detect a current ambient temperature of the information handling system 202, and in particular, a current ambient temperature of the environment 200 proximate to the information handling system 202. The sensor 212 can provide data indicating the current ambient temperature of the information handling system 202 in response to a request, or periodically (e.g., everyone 1 millisecond, 1 second, 1 minute). For example, the current ambient temperature can indicate a temperature of 21° Celsius.

The RAC 210 can calculate a temperature delta based on the maximum supported ambient temperature 220 of the information handling system 202 and the current ambient temperature of the information handling system 202, at 306. That is, the RAC 210 calculates the temperature delta based on a difference between the maximum supported ambient temperature 220 of the information handling system 202 and the current ambient temperature of the information handling system 202. Specifically, the RAC 210 calculates the temperature delta as the current ambient temperature of the information handling system 202 subtracted from the maximum supported ambient temperature 220 of the information handling system 202. For example, when the maximum supported ambient temperature 220 indicates a temperature of 35° Celsius and the current ambient temperature can indicate a temperature of 21° Celsius, the temperature delta is 14° Celsius.

The RAC 210 can adjust, based on the temperature delta, one or more thermal control trigger points 222, at 308. Specifically, the RAC 210 can store data indicating thermal control trigger points 222 of the information handling system 200 (or the RAC 210 can have access to data indicating the thermal control trigger points 222 stored at a data store). In some examples, the thermal control trigger points 222 can include a current ambient temperature indicator. In some examples, the thermal control trigger points 222 can include other trigger points associated with the fan 214, such as node ambient temperature indicator, riser ambient temperature indicator, and memory ambient temperature indicator. In short, the thermal control trigger points 222 can include any ambient temperature indicator of any component of the information handling system 202. The RAC 210 can adjust the current ambient temperature indicator by overriding a value indicated by the current ambient temperature indicator to the maximum supported ambient temperature. That is, the RAC 210 replaces the value indicated by the current ambient temperature indicator with the value of the maximum supported ambient temperature. For example, the RAC 210 overwrites the value of 21° Celsius indicated by the current ambient temperature indicator with the value of 35° Celsius of the maximum supported ambient temperature.

In some examples, the thermal control trigger points 222 can include a target temperature indicator of the processor 216. The RAC 210 can adjust the target temperature indicator by overriding a value indicted by the target temperature indicator of the processor 216 based on the temperature delta. That is, the RAC 210 can decrease the value indicated by the target temperature indicator by the temperature delta and overwrite the value of the target temperature indicator with this decreased value. For example, the RAC 210 overwrites the value of 85° Celsius indicated by the target temperature indicator of the processor 216 with the value of 71° Celsius (the value of 85° Celsius decreased by the temperature delta of 14° Celsius).

The RAC 210 adjusts, based on the adjusted thermal control trigger points 222, a fan speed of the fan 214, at 310. That is, in some examples, the RAC 210 adjusts the fan speed of the 214 based on the overwritten value of the current ambient temperature indicator. As a result, the RAC 210 is able to simulate system airflow based on the maximum supported ambient temperature at the current ambient temperature. For example, the RAC 210 is able to simulate system airflow based on the maximum supported ambient temperature of 35° Celsius at the current ambient temperature of 21° Celsius. In other words, the RAC 210 is able to drive the fan 214 (i.e., fan speed) at a higher simulated temperature (the maximum supported ambient temperature) while in a lower temperature environment (the actual current ambient temperature). For example, the RAC 210 is able to drive the fan 214 (i.e., fan speed) at the maximum supported ambient temperature of 35° Celsius while in a lower temperature environment of 21° Celsius.

That is, in some examples, the RAC 210 adjusts the fan speed of the 214 based on the overwritten value of the target temperature indicator of the processor 216. As a result, the RAC 210 is able to simulate system airflow based on the overwritten value of the target temperature indicator of the processor 216. For example, the RAC 210 is able to simulate system airflow based on the overwritten value of the target temperature indicator of the processor 216 of 71° Celsius when the current ambient temperature is 21° Celsius (as opposed to the maximum supported ambient temperature of 35° Celsius). In other words, the RAC 210 is able to drive the fan 214 (i.e., fan speed) based on the reduced value of the temperature indicator (based on the temperature delta) at a higher simulated temperature (the maximum supported ambient temperature) while in a lower temperature environment (the actual current ambient temperature). For example, the RAC 210 is able to drive the fan 214 (i.e., fan speed) based on the target temperature indicator of the processor 216 of 71° Celsius while the information handling system 200 is in a lower temperature environment of 35° Celsius.

The RAC 210 can determine, based on the adjusted fan speed of the fan 214, an updated cooling capacity associated with the information handling system 202, at 312. Specifically, the RAC 210 can determine the updated cooling capacity of the information handling system 202 based on the higher simulated temperature (the maximum supported ambient temperature) while in a lower temperature environment (the actual current ambient temperature). That is, thermal testing of the information handling system 202 associated with a higher simulated temperature (the maximum supported ambient temperature—35° Celsius) is possible while in the lower temperature environment (the actual current ambient temperature—21° Celsius).

For example, when the sensors 212 detect a current temperature of the processor 216, the RAC 210 is able to calculate a predicted temperature of the processor 216 when the information handling system 202 is at the maximum supported ambient temperature. For example, when the sensors 212 detect a current temperature of the processor 216 as 85° Celsius, the RAC 210 is able to calculate a predicted temperature of the processor 216 of 99° Celsius when the information handling system 202 is at the maximum supported ambient temperature of 35° Celsius.

In some examples, after the RAC 210 determines the updated cooling capacity associated with the information handling system 202, the information handling system 202 (via the fan 214) can dissipate heat from the information handling system 202. That is, the fan 214 dissipates heat from the information handling system 202 based on the updated cooling capacity.

In some examples, after adjusting the thermal control trigger points 222 (at 308), the processor 216 maintains a computing workload level performed by the processor 216. That is, the computational resources expended by the processor 216 are maintained for processing any computing workload at the processor 216 after adjusting the thermal control trigger points 222. In some examples, after adjusting the thermal control trigger points 222 (at 308), the processor 216 adjusts a computing workload level performed by the processor 216. That is, the computational resources expended by the processor 216 are increased or decreased for processing any computing workload at the processor 216 after adjusting the thermal control trigger points 222.

In some examples, the RAC 210 can identify a supported ambient temperature of the information handling system 202. For example, the supported ambient temperature can be any temperature less than the maximum supported ambient temperature of the information handling system 202. The RAC 210 can calculate a temperature delta based on the supported ambient temperature 220 of the information handling system 202 and the current ambient temperature of the information handling system 202. That is, the RAC 210 calculates the temperature delta based on a difference between the supported ambient temperature 220 of the information handling system 202 and the current ambient temperature of the information handling system 202. Specifically, the RAC 210 calculates the temperature delta as the current ambient temperature of the information handling system 202 subtracted from the supported ambient temperature 220 of the information handling system 202. The RAC 210 can adjust, based on the temperature delta, one or more thermal control trigger points 222. The RAC 210 can adjust the current ambient temperature indicator by overriding a value indicated by the current ambient temperature indicator to the supported ambient temperature. That is, the RAC 210 replaces the value indicated by the current ambient temperature indicator with the value of the supported ambient temperature. The RAC 210 adjusts, based on the adjusted thermal control trigger points 222, a fan speed of the fan 214. That is, in some examples, the RAC 210 adjusts the fan speed of the 214 based on the overwritten value of the current ambient temperature indicator. As a result, the RAC 210 is able to simulate system airflow based on the supported ambient temperature at the current ambient temperature. That is, in some examples, the RAC 210 adjusts the fan speed of the 214 based on the overwritten value of the target temperature indicator of the processor 216. As a result, the RAC 210 is able to simulate system airflow based on the overwritten value of the target temperature indicator of the processor 216. The RAC 210 can determine, based on the adjusted fan speed of the fan 214, an updated cooling capacity associated with the information handling system 202. For example, when the sensors 212 detect a current temperature of the processor 216, the RAC 210 is able to calculate a predicted temperature of the processor 216 when the information handling system 202 is at the supported ambient temperature.

Figure 4:
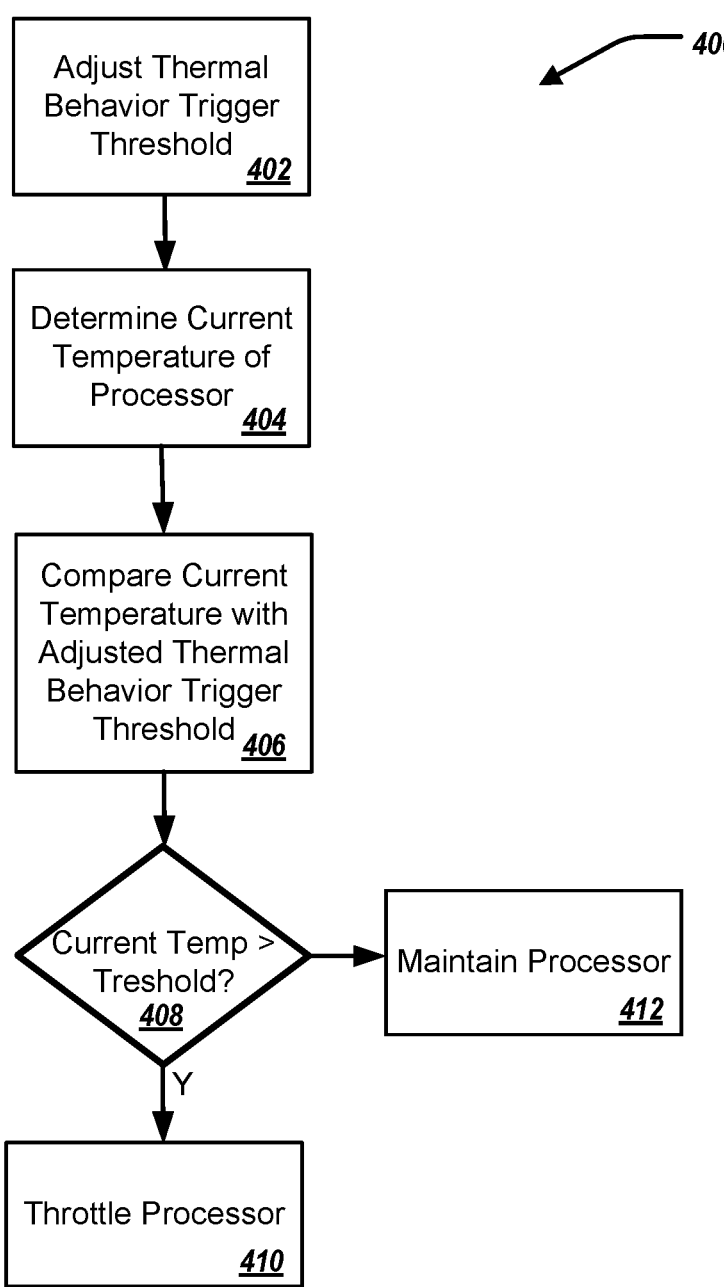

FIG. 4 illustrates a flowchart depicting selected elements of an embodiment of a method 400 for managing thermal capabilities at the information handling system. The method 400 may be performed by the information handling system 100, the information handling system 202 and/or RAC 210, and with reference to FIGS. 1-2. It is noted that certain operations described in method 400 may be optional or may be rearranged in different embodiments.

The RAC 210 adjusts, based on the temperature delta, thermal behavior trigger threshold 224 associated with the processor 216, at 402. Specifically, the RAC 210 can store data indicating the thermal behavior trigger threshold 224 associated with the processor 216 (or the RAC 210 can have access to data indicating the warning temperature threshold 224 stored at a data store). In some examples, the thermal behavior trigger threshold 224 can include multiple temperature thresholds. The thermal behavior trigger threshold 224 can be associated with such activities (trigger activities) as sending warning and error messages, throttling the information handling system 202 and components of the information handling system 202, and shutting down of the information handling system 202. In some examples, adjusting the thermal behavior trigger threshold 224 can include decreasing the thermal behavior trigger threshold 224 by the temperature delta. For example, the (non-critical) thermal behavior trigger 224 is 95° Celsius, and the RAC 210 adjusts the thermal behavior trigger threshold 224 by the temperature delta of 14° Celsius to 81° Celsius. For example, the (critical) thermal behavior trigger threshold 224 is 100° Celsius, and the RAC 210 adjusts the thermal behavior trigger threshold 224 by the temperature delta of 14° Celsius to 86° Celsius.

The RAC 210 determines, based on the processor 216 performing the computing workload level, a current temperature of the processor 216, at 404. That is, the RAC 210 is in communication with the sensors 212. The sensors 212 can include a temperature sensor that can detect a current temperature of the processor 216. The sensor 212 can provide data indicating the current temperature of the processor 216 in response to a request, or periodically (e.g., everyone 1 millisecond, 1 second, 1 minute).

The RAC 210 compares the current temperature of the processor 216 with the adjusted thermal behavior trigger threshold 224, at 406. The RAC 210 can determine whether the current temperature of the processor 216 is greater than the adjusted thermal behavior trigger threshold 224, at 408. In some examples, the RAC 210 determines that the current temperature of the processor 216 is greater than the adjusted thermal behavior trigger threshold 224, and in response, updates an indicator to indicate throttling, at a future time, of the processor 216 when the ambient temperature of the information handling system 202 is greater than or equal to the maximum supported ambient temperature of the information handling system 202, at 410. The indicator can be stored by the RAC 210, or at a data store. In other words, when the current temperature of the processor 216 is greater than the adjusted thermal behavior trigger threshold 224, an indicator can be set indicating that at a later time if/when the ambient temperature of the information handling system 202 is greater than or equal to the maximum supported ambient temperature of the information handling system 202, the processor 216 is to be throttled.

In some examples, the RAC 210 determines that the current temperature of the processor 216 is greater than the adjusted thermal behavior trigger threshold 224, and in response, provides a notification on a display of the information handling system 202 indicating throttling, at a future time, of the processor 216 when the ambient temperature of the information handling system 202 is greater than or equal to the maximum supported ambient temperature of the information handling system 202. In other words, when the current temperature of the processor 216 is greater than the adjusted thermal behavior trigger threshold 224, a notification can be provided on the display indicating that at a later time if/when the ambient temperature of the information handling system 202 is greater than or equal to the maximum supported ambient temperature of the information handling system 202, the processor 216 is to be throttled. In some examples, when the RAC 210 determines that the current temperature of the processor 216 is greater than the adjusted thermal behavior trigger threshold 224, the RAC 210 provide a notification on a display of the information handling system 202 indicating a warning/error message that the current temperature of the processor 216 is greater than the adjusted thermal behavior trigger threshold 224. In some examples, when the RAC 210 determines that the current temperature of the processor 216 is greater than the adjusted thermal behavior trigger threshold 224, the RAC 210 can throttle the processor 216. In some examples, when the RAC 210 determines that the current temperature of the processor 216 is greater than the adjusted thermal behavior trigger threshold 224, the RAC 210 can facilitate shutdown of the information handling system 202.

In some examples, the RAC 210 determines that the current temperature of the processor 216 is less than the adjusted thermal behavior trigger threshold 224, and in response, maintains a computing workload level performed by the processor 216

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computer-implemented method of managing thermal capabilities of an information handling system, comprising:
   identifying a maximum supported ambient temperature of the information handling system;
   identifying a current ambient temperature of the information handling system;
   calculating a temperature delta based on the maximum supported ambient temperature of the information handling system and the current ambient temperature of the information handling system;
   adjusting, based on the temperature delta, one or more thermal control trigger points;
   adjusting, based on the adjusted thermal control trigger points, a fan speed of a fan of the information handling system;
   determining, based on the adjusted fan speed of the fan, an updated cooling capacity associated with the information handling system; and
   dissipating, by the fan and based on the updated cooling capacity associated with the information handling system, heat of the information handling system.

2. The computer-implemented method of claim 1, further comprising:
   after adjusting the thermal control trigger points, maintaining a computing workload level performed by a processor of the information handling system.

3. The computer-implemented method of claim 2, further including:
   adjusting, based on the temperature delta, a thermal behavior trigger threshold associated with the processor of the information handling system;
   determining, based on performing the computing workload level, a current temperature of the processor;
   comparing the current temperature of the processor with the adjusted thermal behavior trigger threshold;

12 determining, based on the comparing, that the current temperature of the processor is greater than the adjusted thermal behavior trigger threshold; and
in response to determining that the current temperature of the processor is greater than the adjusted thermal behavior trigger threshold, updating an indicator to indicate throttling of the processor when the current ambient temperature of the information handling system is greater than or equal to the maximum supported ambient temperature of the information handling system.

4. The computer-implemented method of claim 3, wherein adjusting the thermal behavior trigger threshold further includes decreasing the thermal behavior trigger threshold by the temperature delta.

5. The computer-implemented method of claim 3, further including:
   in response to determining that the current temperature of the processor is greater than the adjusted thermal behavior trigger threshold, displaying a notification on a display of the information handling system indicating the throttling when the current ambient temperature of the information handling system is greater than or equal to the maximum supported ambient temperature of the information handling system.

6. The computer-implemented method of claim 1, wherein adjusting the thermal control trigger points further includes overriding a value indicated by a current ambient temperature indicator to the maximum supported ambient temperature.

7. The computer-implemented method of claim 1, wherein adjusting the thermal control trigger points further includes overriding a value indicated by a target temperature indicator of a processor of the information handling system based on the temperature delta.

8. The computer-implemented method of claim 7, wherein overriding the value indicated by the target temperature indicator of the processor further includes decreasing the value indicated by the target temperature indicator of the processor by the temperature delta.

9. An information handling system comprising a processor having access to memory media storing instructions executable by the processor to perform operations, comprising:
   identifying a maximum supported ambient temperature of the information handling system;
   identifying a current ambient temperature of the information handling system;
   calculating a temperature delta based on the maximum supported ambient temperature of the information handling system and the current ambient temperature of the information handling system;
   adjusting, based on the temperature delta, one or more thermal control trigger points;
   adjusting, based on the adjusted thermal control trigger points, a fan speed of a fan of the information handling system;
   determining, based on the adjusted fan speed of the fan, an updated cooling capacity associated with the information handling system; and
   dissipating, by the fan and based on the updated cooling capacity associated with the information handling system, heat of the information handling system.

10. The information handling system of claim 9, the operations further comprising:

after adjusting the thermal control trigger points, maintaining a computing workload level performed by a processor of the information handling system.

11. The information handling system of claim 10, the operations further comprising:

adjusting, based on the temperature delta, a thermal behavior trigger threshold associated with the processor of the information handling system;

determining, based on performing the computing workload level, a current temperature of the processor;

comparing the current temperature of the processor with the adjusted thermal behavior trigger threshold;

determining, based on the comparing, that the current temperature of the processor is greater than the adjusted thermal behavior trigger threshold; and in response to determining that the current temperature of the processor is greater than the adjusted thermal behavior trigger threshold, updating an indicator to indicate throttling of the processor when the current ambient temperature of the information handling system is greater than or equal to the maximum supported ambient temperature of the information handling system.

12. The information handling system of claim 11, wherein adjusting the warning thermal behavior trigger further includes decreasing the thermal behavior trigger threshold by the temperature delta.

13. The information handling system of claim 11, the operations further comprising:

in response to determining that the current temperature of the processor is greater than the adjusted thermal behavior trigger threshold, displaying a notification on a display of the information handling system indicating the throttling when the current ambient temperature of the information handling system is greater than or equal to the maximum supported ambient temperature of the information handling system.

14. The information handling system of claim 9, wherein adjusting the thermal control trigger points further includes overriding a value indicated by a current ambient temperature indicator to the maximum supported ambient temperature.

15. The information handling system of claim 9, wherein adjusting the thermal control trigger points further includes overriding a value indicated by a target temperature indicator of a processor of the information handling system based on the temperature delta.

16. The information handling system of claim 15, wherein overriding the value indicated by the target temperature indicator of the processor further includes decreasing the value indicated by the target temperature indicator of the processor by the temperature delta.

17. A non-transitory computer-readable medium storing software comprising instructions executable by one or more computers which, upon such execution, cause the one or more computers to perform operations comprising:

identifying a maximum supported ambient temperature of the information handling system;

identifying a current ambient temperature of the information handling system;

calculating a temperature delta based on the maximum supported ambient temperature of the information handling system and the current ambient temperature of the information handling system;

adjusting, based on the temperature delta, one or more thermal control trigger points;

adjusting, based on the adjusted thermal control trigger points, a fan speed of a fan of the information handling system;

determining, based on the adjusted fan speed of the fan, an updated cooling capacity associated with the information handling system; and dissipating, by the fan and based on the updated cooling capacity associated with the information handling system, heat of the information handling system.

* * * * *